United States Patent
Shimazu et al.

(10) Patent No.: US 12,283,536 B2
(45) Date of Patent: Apr. 22, 2025

(54) POWER SEMICONDUCTOR DEVICE AND MANUFACTURING METHOD OF POWER SEMICONDUCTOR DEVICE

(71) Applicant: HITACHI ASTEMO, LTD., Hitachinaka (JP)

(72) Inventors: Hiromi Shimazu, Tokyo (JP); Yujiro Kaneko, Hitachinaka (JP); Eiichi Ide, Tokyo (JP); Yusuke Takagi, Hitachinaka (JP); Hisashi Tanie, Tokyo (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 399 days.

(21) Appl. No.: 17/772,943

(22) PCT Filed: Sep. 29, 2020

(86) PCT No.: PCT/JP2020/036784
§ 371 (c)(1),
(2) Date: Apr. 28, 2022

(87) PCT Pub. No.: WO2021/085006
PCT Pub. Date: May 6, 2021

(65) Prior Publication Data
US 2022/0375820 A1    Nov. 24, 2022

(30) Foreign Application Priority Data
Oct. 30, 2019   (JP) ................... 2019-197975

(51) Int. Cl.
| H01L 23/24 | (2006.01) |
| H01L 21/52 | (2006.01) |
| H01L 23/40 | (2006.01) |
| H01L 25/07 | (2006.01) |
| H01L 25/18 | (2023.01) |
| H05K 7/20 | (2006.01) |

(52) U.S. Cl.
CPC .............. *H01L 23/40* (2013.01); *H01L 25/07* (2013.01); *H01L 25/18* (2013.01); *H05K 7/20* (2013.01)

(58) Field of Classification Search
CPC ....... H01L 23/4006; H01L 2224/48091; H01L 2023/405; H01L 2023/4081
See application file for complete search history.

(56) References Cited

U.S. PATENT DOCUMENTS 4,415,025 A * 11/1983 Horvath ................ H01L 23/433
                                                          257/E23.09
7,100,281 B2 * 9/2006 Kemink .............. H01L 21/4882
                                                           29/890.047
(Continued)

FOREIGN PATENT DOCUMENTS

DE    10 2017 222 350 A1    6/2018
JP       2004-363521 A       12/2004
(Continued)

OTHER PUBLICATIONS

German Office Action issued in corresponding DE Application No. 112020004722.9, dated Jul. 9, 2024 with English translation (8 pages).

(Continued)

*Primary Examiner* — Kyoung Lee
*Assistant Examiner* — David J Goodwin
(74) *Attorney, Agent, or Firm* — Foley & Lardner LLP

(57) ABSTRACT

A problem is that close contact with a heat dissipation surface of a power semiconductor device is not sufficient, and thus heat dissipation performance is low. A thermally conductive layer 5 abuts on a heat dissipation surface 4a of a circuit body 100, and a heat dissipation member 7 abuts on the outside of the thermally conductive layer 5, which is a side of the heat dissipation surface 4a of the circuit body 100. A fixing member 8 abuts on a side of the circuit body (Continued)

100 opposite to the heat dissipation surface 4a. A connection member 9 is penetrated at the respective end portions of the heat dissipation member 7 and the fixing member 8. FIG. 3 illustrates a state before a bolt and a nut of the connection member 9 are tightened. The heat dissipation member 7 holds a curved shape such that the central portion of the heat dissipation member 7 protrudes toward the circuit body 100. The bolt and the nut of the connection member 9 are fastened and fixed at both ends of the heat dissipation member 7 and the fixing member 8 so as to sandwich the circuit body 100. The heat dissipation member 7 is elastically deformed to bring the heat dissipation member 7 into close contact with the heat dissipation surface 4a of the circuit body 100 via the thermally conductive layer 5, and surface pressure is applied from the heat dissipation member 7 to the heat dissipation surface 4a.

12 Claims, 12 Drawing Sheets

(56) References Cited

U.S. PATENT DOCUMENTS

| | | | | |
|---|---|---|---|---|
| 2007/0075412 | A1* | 4/2007 | Reid | H05K 1/021 |
| | | | | 257/686 |
| 2009/0116197 | A1* | 5/2009 | Funakoshi | H01L 21/4882 |
| | | | | 438/122 |
| 2011/0147918 | A1 | 6/2011 | Hayashi et al. | |
| 2011/0214842 | A1* | 9/2011 | Lee | F28F 1/32 |
| | | | | 165/185 |
| 2013/0328185 | A1* | 12/2013 | Hiramitsu | H01L 21/52 |
| | | | | 438/122 |
| 2014/0291833 | A1 | 10/2014 | Sato et al. | |
| 2017/0309499 | A1 | 10/2017 | Oi et al. | |
| 2018/0166357 | A1 | 6/2018 | Machler et al. | |
| 2019/0074238 | A1 | 3/2019 | Okada et al. | |
| 2019/0157183 | A1 | 5/2019 | Kai et al. | |

FOREIGN PATENT DOCUMENTS

| | | |
|---|---|---|
| JP | 2011-129739 A | 6/2011 |
| JP | 2014-203892 A | 10/2014 |
| JP | 2016-82234 A | 5/2016 |
| JP | 2017-212401 A | 11/2017 |
| JP | 2019-47049 A | 3/2019 |
| WO | WO-2018/146933 A1 | 8/2018 |

OTHER PUBLICATIONS

International Search Report with English Translation and Written Opinion for Application No. PCT/JP2020/036784, dated Jan. 26, 2021 (8 pages).

* cited by examiner

POWER SEMICONDUCTOR DEVICE AND MANUFACTURING METHOD OF POWER SEMICONDUCTOR DEVICE

TECHNICAL FIELD

The present invention relates to a power semiconductor device and a manufacturing method of the power semiconductor device.

BACKGROUND ART

In recent years, hybrid automobiles and electric automobiles have become widespread in order to reduce the load on the environment. In hybrid vehicles and electric vehicles, it is important to improve the performance of components to be mounted, and size reduction and cost reduction are required without exception for a power conversion device that converts DC power into AC power.

In order to reduce the size of a power semiconductor device that generates a large amount of heat among electronic components constituting a power conversion device, it is necessary to improve cooling performance. In PTL 1, a heat dissipation surface of a power semiconductor device is brought into close contact with a case cooling surface and fixed to a metal case, by a fastening fixing force applied to the outer peripheral portion of the power semiconductor device.

CITATION LIST

Patent Literature

PTL 1: JP 2017-212401 A

SUMMARY OF INVENTION

Technical Problem

In the related art, close contact with a heat dissipation surface of a power semiconductor device is not sufficient, and thus heat dissipation performance is low.

Solution to Problem

According to the present invention, a power semiconductor device includes a circuit body in which a power semiconductor element is mounted, a first heat dissipation member that is disposed on a first heat dissipation surface side of the circuit body and dissipates heat of the circuit body, and a fixing member that is disposed on a side of the circuit body opposite to the first heat dissipation surface. When the first heat dissipation member and the fixing member are connected and fixed, the curved first heat dissipation member that protrudes toward a central portion on the first heat dissipation surface side is elastically deformed to come into close contact with the first heat dissipation surface side.

According to the present invention, there is provided a manufacturing method of a power semiconductor device. The manufacturing method includes disposing a first heat dissipation member curved to protrude toward a central portion on a side of a circuit body, on a first heat dissipation surface of the circuit body in which a power semiconductor element is mounted, disposing a fixing member on a surface of the circuit body opposite to the first heat dissipation surface, and connecting and fixing the first heat dissipation member and the fixing member so that the first heat dissipation member is elastically deformed so as to apply surface pressure to the first heat dissipation surface of the circuit body.

According to the present invention, there is provided a manufacturing method of a power semiconductor device. The manufacturing method includes disposing a first heat dissipation member curved to protrude toward a central portion on side of a circuit body, on a first heat dissipation surface of the circuit body in which a power semiconductor element is mounted, disposing a second heat dissipation member curved to protrude toward the central portion on the circuit body side, on a second heat dissipation surface on an opposite side of the first heat dissipation surface of the circuit body, and connecting and fixing the first heat dissipation member and the second heat dissipation member by elastically deforming the first heat dissipation member and the second heat dissipation member so as to apply surface pressure to the first heat dissipation surface and the second heat dissipation surface of the circuit body.

Advantageous Effects of Invention

According to the present invention, it is possible to enhance the close contact with the heat dissipation surface and improve the heat dissipation performance.

DESCRIPTION OF EMBODIMENTS

Figure 1:
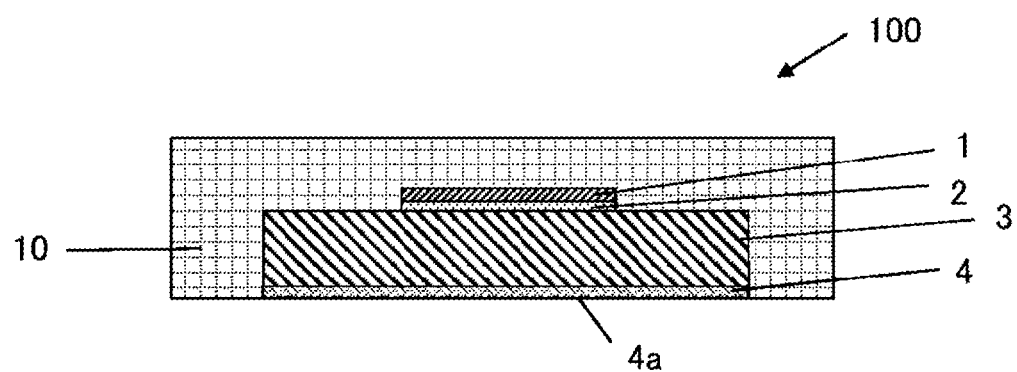
FIG. 1 is a cross-sectional view of a circuit body.

Hereinafter, embodiments of the present invention will be described with reference to the drawings. The following description and drawings are examples for describing the present invention, and are omitted and simplified as appropriate for clarity of description. The present invention can be carried out in various other forms. Unless otherwise specified, each component may be singular or plural.

Positions, sizes, shapes, ranges, and the like of the components illustrated in the drawings may not represent actual positions, sizes, shapes, ranges, and the like in order to facilitate understanding of the invention. Therefore, the present invention is not necessarily limited to the positions, sizes, shapes, ranges, and the like illustrated in the drawings.

First Embodiment

FIG. 1 is a cross-sectional view of a circuit body 100. The circuit body 100 is mounted in a power semiconductor device 200 described later.

As illustrated in FIG. 1, the circuit body 100 includes a power semiconductor element 1, a bonding material 2, a first conductor 3, an insulating layer 4, and a sealing resin 10. The back electrode of the power semiconductor element 1 is bonded to the first conductor 3 by the bonding material 2, and the insulating layer 4 having thermal conductivity is connected to the surface of the first conductor 3 opposite to the surface to which the power semiconductor element 1 is connected. The circuit body 100 is formed by sealing the insulating layer 4 with the sealing resin 10 so as to be exposed to the surface. The surface of the insulating layer exposed from the sealing resin 10 serves as a heat dissipation surface 4a of the circuit body 100.

The bonding material 2 is formed of a solder material, a sintered material, or the like. The first conductor 3 formed of, for example, copper, a copper alloy, aluminum, an aluminum alloy, or the like.

The insulating layer 4 thermally conducts heat generated from the power semiconductor element 1 to a heat dissipation member 7 described later, and is formed of a material having high thermal conductivity and a high withstand voltage. For example, ceramics such as aluminum oxide (alumina), aluminum nitride, and silicon nitride, or an insulating sheet or an adhesive containing the fine powders of the ceramics is used.

Figure 2:
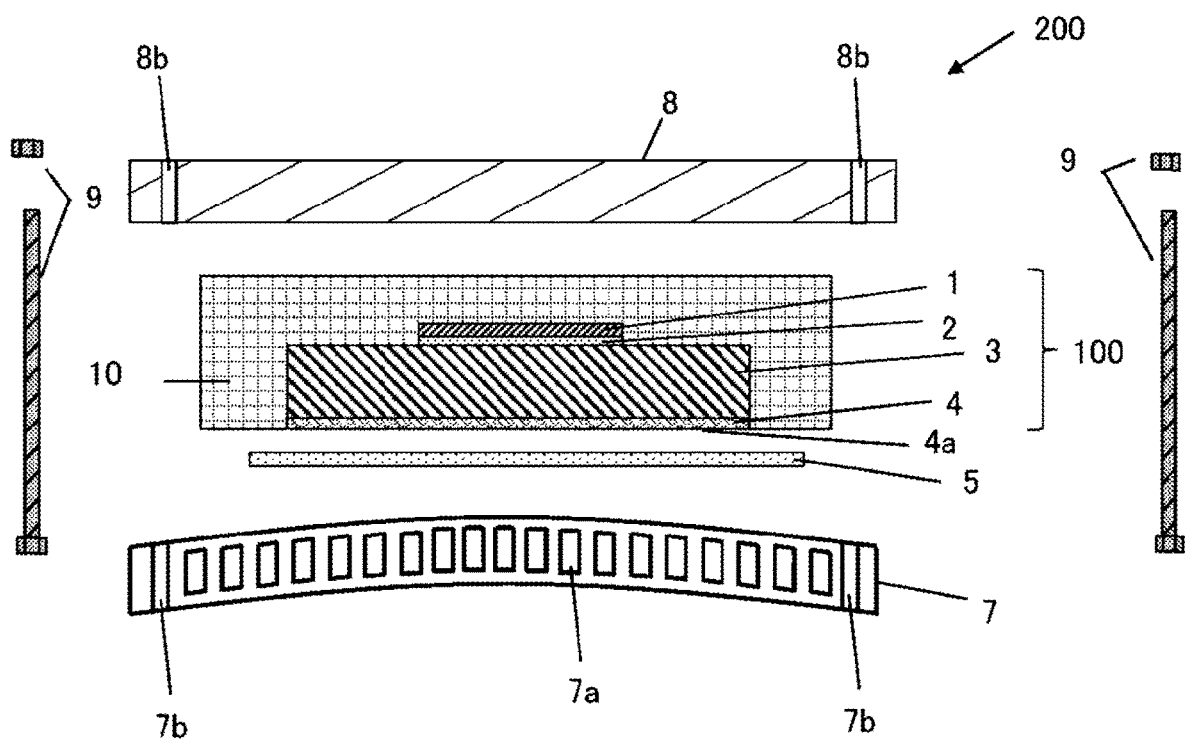
FIG. 2 is a cross-sectional view of a power semiconductor device, illustrating a first step.

FIG. 2 is a cross-sectional view of the power semiconductor device 200, and illustrates a first step of manufacturing the power semiconductor device 200 in which necessary components are arranged.

As illustrated in FIG. 2, a thermally conductive layer 5 is disposed on a side of the heat dissipation surface 4a of the circuit body 100. As the thermally conductive layer 5, grease, thermal interface material (TIM), or the like is used.

Further, the heat dissipation member 7 is disposed on an outside of the thermally conductive layer 5 on the side of the heat dissipation surface 4a of the circuit body 100. The heat dissipation member 7 has a shape in which a central portion thereof is curved to protrude toward the circuit body 100. A multi-hole tube cooling water channel in which a plurality of tubular cooling water channel pipes 7a serving as flow paths of cooling water are provided will be described as an example of the heat dissipation member 7. Holes 7b through which connection members 9 described later pass are provided at both end portions of the heat dissipation member 7.

The shape of the heat dissipation member 7 curved to protrude toward the circuit body 100 is formed by using a curved mold when processed by extrusion molding. Thus, it is possible to form the heat dissipation member 7 having a curved shape without increasing the number of steps and cost. In addition, the heat dissipation member 7 having a curved shape can be formed by warping the heat dissipation member 7 by press working. The cooling water channel pipe 7a is processed by extrusion molding. The heat dissipation member 7 is formed of a member having thermal conductivity, for example, a composite material such as Cu, a Cu alloy, Cu—C, or Cu—CuO, or a composite material such as Al, an Al alloy, AlSiC, or Al—C.

A fixing member 8 is disposed on a side of the circuit body 100 opposite to the heat dissipation surface 4a. The fixing member 8 has a surface parallel to a surface of the circuit body 100 opposite to the heat dissipation surface 4a. Holes 8b through which the connection members 9 described later pass are provided at both end portions of the fixing member 8. As the fixing member 8, for example, a composite material such as Cu, a Cu alloy, Cu—C, or Cu—CuO, a composite material such as Al, an Al alloy, AlSiC, or Al—C, or metal such as stainless steel is used.

As will be described later, the connection member 9 is a member that connects and fixes the heat dissipation member 7 and the fixing member 8 at the respective end portions. As the connection member 9, for example, a bolt and a nut made of stainless steel are used.

Figure 3:
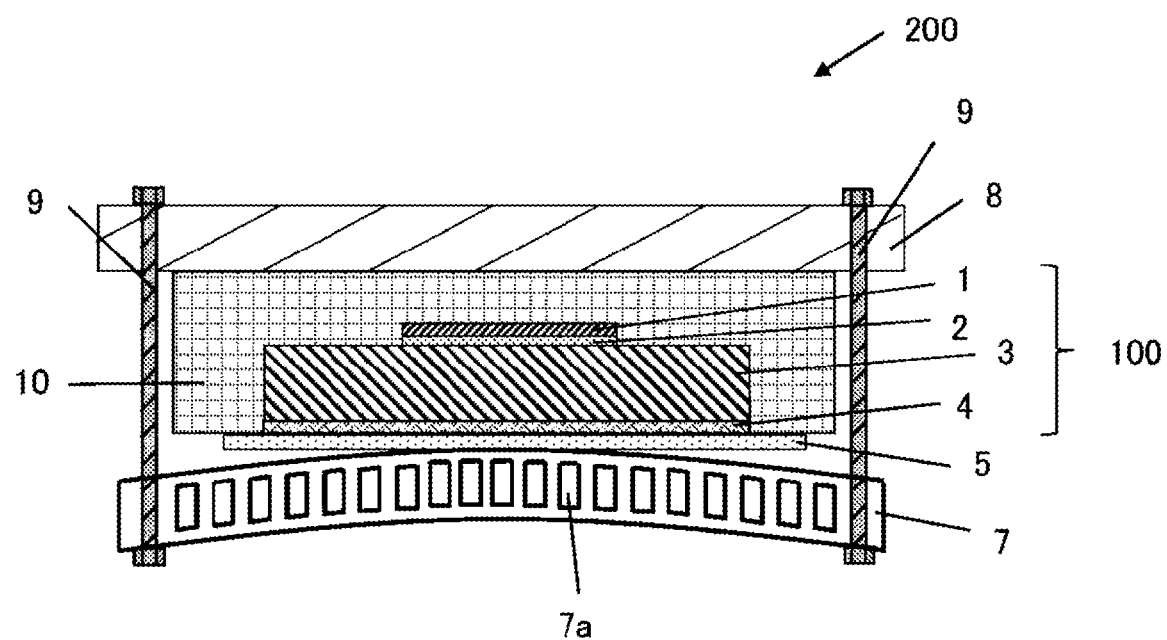
FIG. 3 is a cross-sectional view of the power semiconductor device, illustrating a second step.

FIG. 3 is a cross-sectional view of the power semiconductor device 200, illustrating a second step of manufacturing the power semiconductor device 200 incorporating necessary components.

As illustrated in FIG. 3, the thermally conductive layer 5 abuts on the heat dissipation surface 4a of the circuit body 100. Further, the heat dissipation member 7 abuts on the outside of the thermally conductive layer 5 on the side of the heat dissipation surface 4a of the circuit body 100. The fixing member 8 abuts on the side of the circuit body 100 opposite to the heat dissipation surface 4a. The connection member 9 penetrates at the respective end portions of the heat dissipation member 7 and the fixing member 8. FIG. 3 illustrates a state before a bolt and a nut of the connection member 9 are tightened. The heat dissipation member 7 holds a curved shape such that the central portion of the heat dissipation member 7 protrudes toward the circuit body 100.

Figure 4:
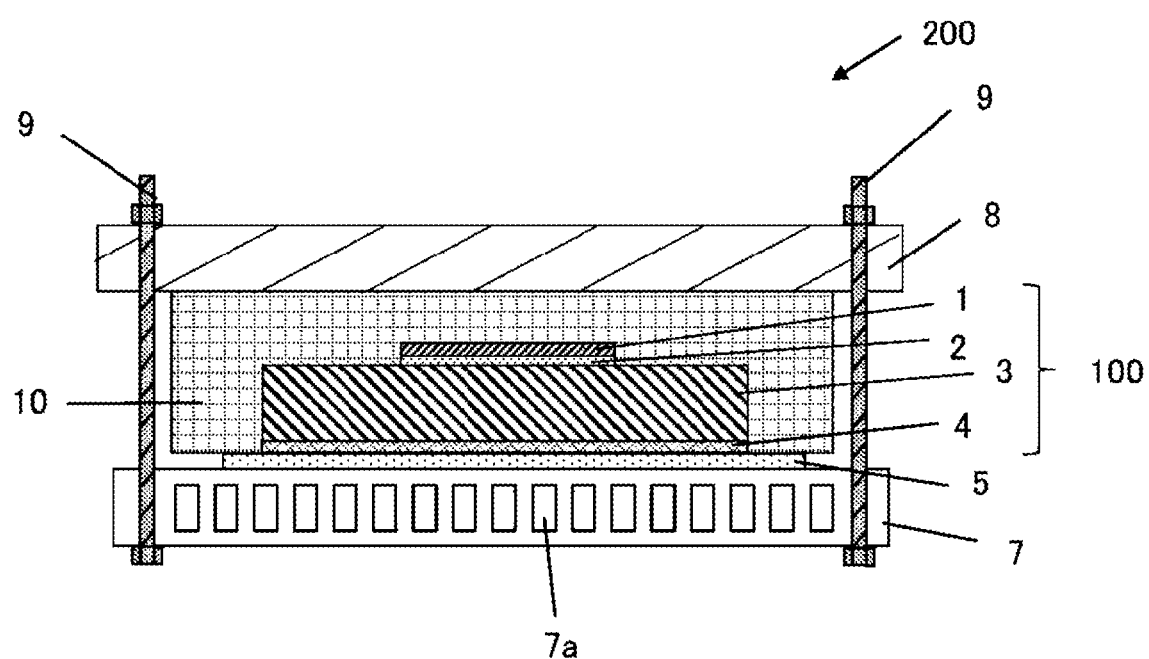
FIG. 4 is a cross-sectional view of the power semiconductor device, illustrating a third step.

FIG. 4 is a cross-sectional view of the power semiconductor device 200, and illustrates a third step of manufacturing the power semiconductor device 200.

As illustrated in FIG. 4, the bolt and the nut of the connection member 9 are fastened and fixed at both ends of the heat dissipation member 7 and the fixing member 8 so as to sandwich the circuit body 100. At this time, the heat dissipation member 7 is elastically deformed. As a result, the heat dissipation member 7 is brought into close contact with the heat dissipation surface 4a of the circuit body 100 via the thermally conductive layer 5, and surface pressure is applied from the heat dissipation member 7 is applied to the heat dissipation surface 4a.

In the present embodiment, before manufacturing the power semiconductor device 200, the heat dissipation member 7 has a shape in which the central portion thereof is curved to protrude toward the circuit body 100, and has a function of a leaf spring. Therefore, after manufacturing the power semiconductor device 200, the heat dissipation member 7 is elastically deformed by the fixing member 8 and the connection member 9, and the heat dissipation member 7 is fixed in close contact with the heat dissipation surface 4a of the circuit body 100 via the thermally conductive layer 5. This makes it possible to generate surface pressure in a wide range of the thermally conductive layer 5, particularly, in a heat dissipation path in the central portion, without adding a member such as a leaf spring. As a result, the contact thermal resistance of the thermally conductive layer 5 is reduced, and the heat dissipation of the power semiconductor device 200 is improved.

Figure 5:
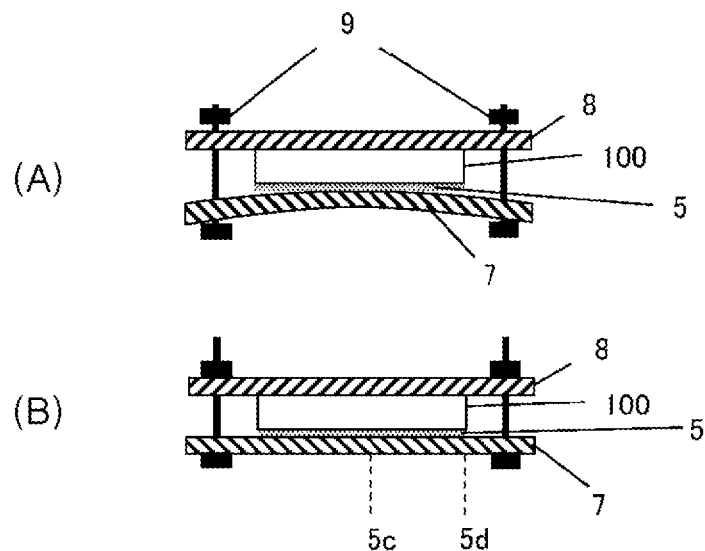
FIGS. 5(A) and 5(B) are simplified cross-sectional views before and after fixing a heat dissipation member.
Figure 6:
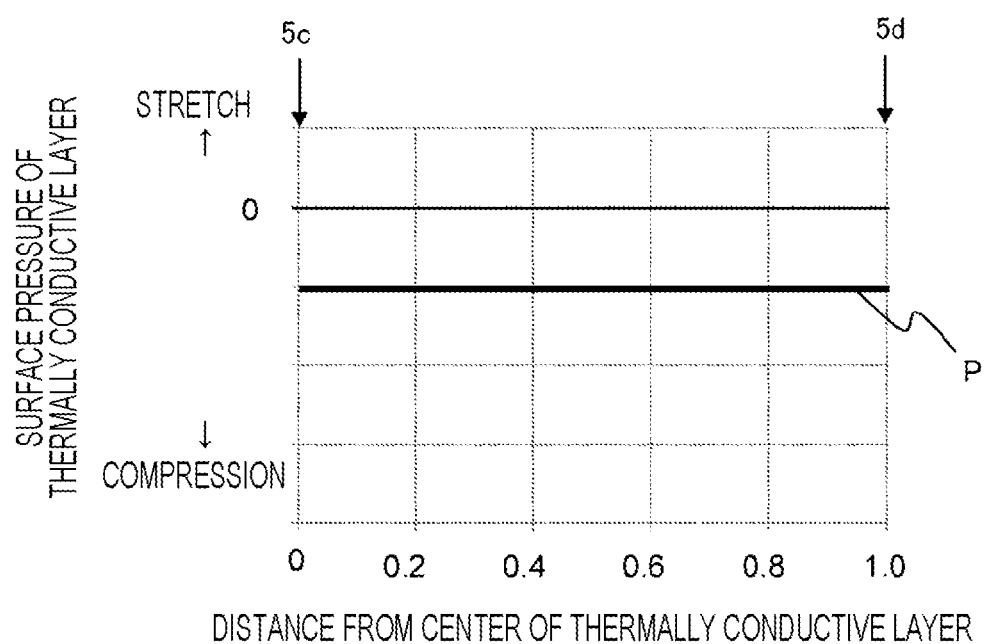
FIG. 6 illustrates a surface pressure distribution of a thermally conductive layer.

FIG. 5(A) is a simplified cross-sectional view before fixing the heat dissipation member 7, and FIG. 5(B) is a simplified cross-sectional view after fixing the heat dissipation member 7. FIG. 6 illustrates a surface pressure distribution of the heat dissipation member 7 with respect to the thermally conductive layer 5, after the heat dissipation member 7 is fixed. The horizontal axis in FIG. 6 indicates a dimensionless value of a distance from the center 5c of the thermally conductive layer 5, that is, the distance from the center to the end portion when the center 5c of the thermally conductive layer 5 is set to zero and the end portion 5d of the thermally conductive layer 5 is set to 1. The vertical axis in FIG. 6 indicates surface pressure applied to the thermally conductive layer 5 by the heat dissipation member 7 FIG. 6 illustrates results of simulating the surface pressure distribution of the thermally conductive layer 5 by the finite element method.

According to the present embodiment, the heat dissipation member 7 has a shape in which the central portion is curved to protrude toward the circuit body 100. When a state before fixing the heat dissipation member 7 illustrated in FIG. 5(A) is changed to a state after fixing the heat dissipation member 7 illustrated in FIG. 5(B), the surface pressure distribution of the thermally conductive layer 5 is as illustrated in FIG. 6. As illustrated in the graph P in FIG. 6, the surface pressure in a compression direction, which is applied from the heat dissipation member 7 to the thermally conductive layer 5, is uniformly applied over the entire distance.

That is, the heat dissipation member 7 having a shape curved to protrude toward the circuit body 100 is elastically deformed by the connection member 9 such as the bolt and the nut such that the amount of protrusion toward the circuit body 100 is reduced. At this time, it is preferable that the amount of protrusion of the heat dissipation member 7 after fixing is slightly convex toward the circuit body 100 or has a flat shape. After the heat dissipation member 7 is fixed, as illustrated in FIG. 6, the surface pressure in the compression direction is generated entirely at an interface with the heat dissipation member 7 in the thermally conductive layer 5. The surface pressure at which the heat dissipation member 7 and the thermally conductive layer 5 are in close contact with each other may be set to be larger on the central portion side of the circuit body 100 than on the end portion side of the circuit body 100. Furthermore, the heat dissipation member 7 in a state where the heat dissipation member 7 is fixed while being elastically deformed may be set to have a shape protruding toward the circuit body 100 in the central portion of the heat dissipation member 7, or to have a flat shape toward the circuit body 100 on the entire surface of the heat dissipation member 7.

Figure 7:
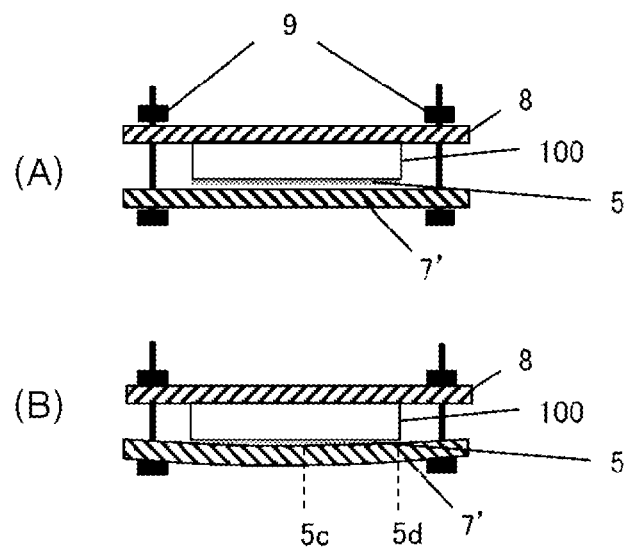
FIGS. 7(A) and 7(B) are simplified cross-sectional views before and after fixing a heat dissipation member, in a comparative example.
Figure 8:
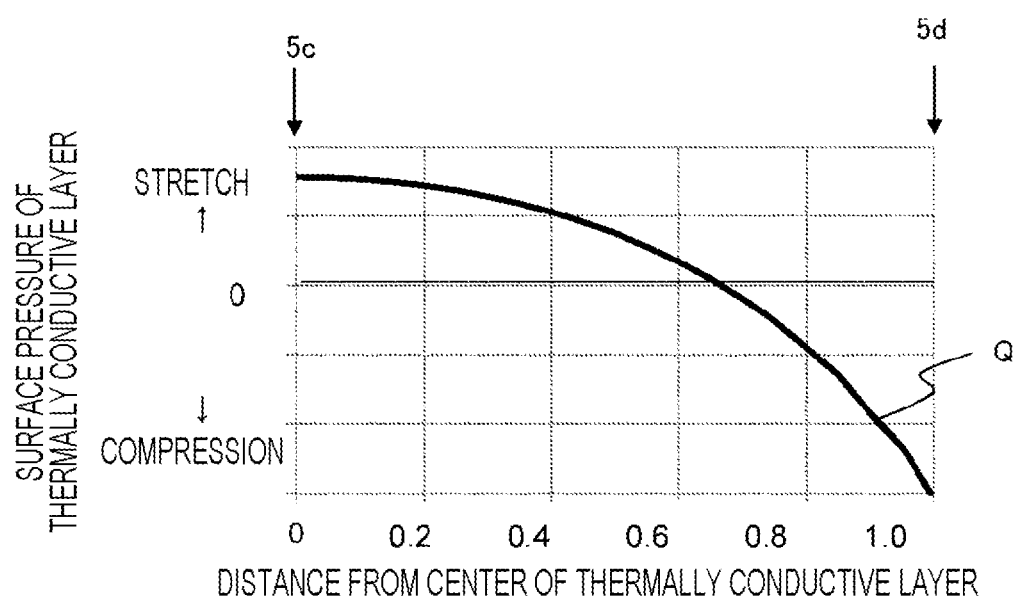
FIG. 8 illustrates a surface pressure distribution of a thermally conductive layer in the comparative example.

For comparison with the present embodiment, FIGS. 7(A), 7(B), and 8 illustrate a comparative example in which a heat dissipation member 7' that is not curved is used.

FIG. 7(A) is a simplified cross-sectional view before fixing the heat dissipation member 7', and FIG. 7(B) is a simplified cross-sectional view after fixing the heat dissipation member 7'. FIG. 8 illustrates a surface pressure distribution of the heat dissipation member 7' with respect to the thermally conductive layer 5, after the heat dissipation member 7' is fixed. FIG. 8 illustrates results of simulating the surface pressure distribution of the thermally conductive layer 5 by the finite element method.

The heat dissipation member 7' has a flat plate shape. When a state before fixing the heat dissipation member 7' illustrated in FIG. 5(A) is changed to a state after fixing the heat dissipation member 7' illustrated in FIG. 5(B), the surface pressure distribution of the thermally conductive layer 5 is as illustrated in FIG. 8. As illustrated in the graph Q in FIG. 8, tension is applied to the central portion of the thermally conductive layer 5, and the surface pressure in the compression direction is applied to both end portions of the thermally conductive layer 5.

That is, as illustrated in FIG. 8, when the heat dissipation member 7' having a flat plate shape that is not curved is fixed at both ends, the heat dissipation member 7' is elastically deformed to be recessed toward the circuit body 100 with the end portion of the circuit body 100 as a fulcrum. In this case, in the surface pressure distribution generated in the thermally conductive layer 5, as illustrated in FIG. 8, the compression surface pressure is generated only in the vicinity of the periphery serving as the fulcrum of the end portion of the circuit body 100, and it is not possible to generate the compression surface pressure in the vicinity of the central portion of the heat dissipation member 7.

In the power semiconductor device 200 according to the present embodiment illustrated in FIG. 4, during an operation of the power semiconductor device 200, the power semiconductor element 1 generates heat, and the heat is thermally conducted to the bonding material 2 and the first conductor 3. The heat is further thermally conducted to the insulating layer 4 and the thermally conductive layer 5, and is dissipated to the heat dissipation member 7. At this time, since the temperature rises highest around the power semiconductor element 1, it is important to improve heat dissipation in a region of the thermally conductive layer 5 close to the power semiconductor element 1. That is, since the compression surface pressure of the thermally conductive layer 5 does not decrease in the central portion of the thermally conductive layer 5 close to the power semiconductor element 1 as compared with the end portion of the circuit body 100 far from the power semiconductor element 1, the power semiconductor device 200 according to the present embodiment can obtain high heat dissipation performance.

As illustrated in FIG. 4, in order to fix the heat dissipation member 7 while being elastically deformed, it is necessary to apply a load to both ends of the heat dissipation member 7 from the opposite side of the heat dissipation member 7 with the circuit body 100 sandwiched between the connection members 9 such as bolts and nuts. At this time, the rigidity of a load application portion at the end portion of the heat dissipation member 7 is desirably higher than the rigidity of a heat dissipation portion (that is, the elastically deforming portion) which is the central portion of the heat dissipation member 7. By making the rigidity of the load application portion at the end portion higher than the rigidity of the heat dissipating portion (that is, the elastically deforming portion), it is possible to elastically deform the heat dissipation portion with high efficiency when the end portion is forcibly displaced by the connection member 9 such as a bolt, and a load is applied. For example, the plate thickness of the load application portion of the heat dissipation member 7 is desirably greater than the base thickness of the heat dissipation portion provided with the cooling water channel pipe. Thus, when the heat dissipation member 7 is forcibly displaced by the connection member 9 and a load is applied, it is possible to elastically deform the heat dissipation portion with high efficiency. Then, it is possible to generate the compressive stress in a wide region including the central portion of the thermally conductive layer 5. As a result, it is possible to realize the power semiconductor device 200 in which the contact thermal resistance of the thermally conductive layer 5 is reduced, and the heat dissipation performance is high.

Modification Example 1

Figure 9:
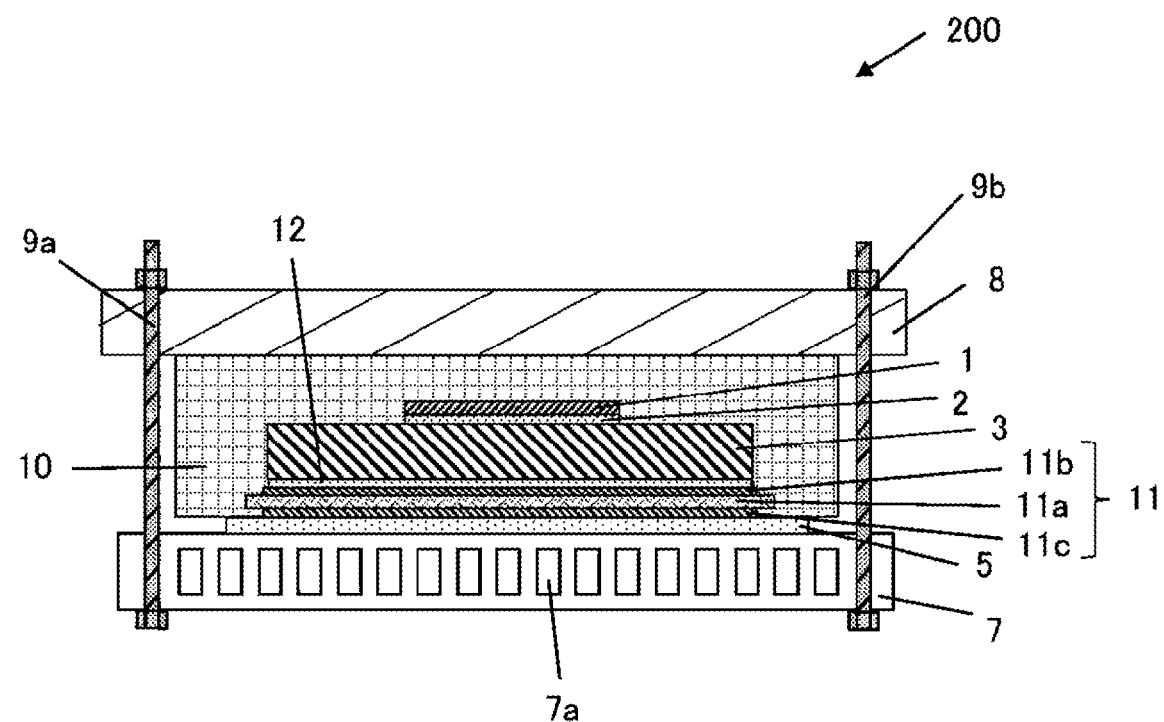
FIG. 9 is a cross-sectional view illustrating a power semiconductor device according to Modification Example 1.

FIG. 9 is a cross-sectional view illustrating a modification example of the power semiconductor device 200. The same portions as those in FIG. 4 are denoted by the same reference signs, and the description thereof will be omitted. FIG. 9 is different from FIG. 4 in that a ceramic substrate 11 with a conductor is provided in FIG. 9 instead of the insulating layer 4 illustrated in FIG. 4.

As illustrated in FIG. 9, in the ceramic substrate 11 with a conductor, a first conductor layer 11b is disposed on one surface of a ceramic substrate 11a, and a second conductor layer 11c is disposed on the other surface. The first conductor layer 11b of the ceramic substrate 11 with a conductor is connected to the first conductor 3 by a bonding material 12.

The first conductor layer 11b and the second conductor layer 11c are formed of, for example, copper, a copper alloy, aluminum, an aluminum alloy, or the like. The bonding material 12 is formed of a solder material, a sintered material, or the like. By using the ceramic substrate 11 with a conductor, a power semiconductor device 200 having a high withstand voltage and high heat dissipation is provided.

Modification Example 2

Figure 10:
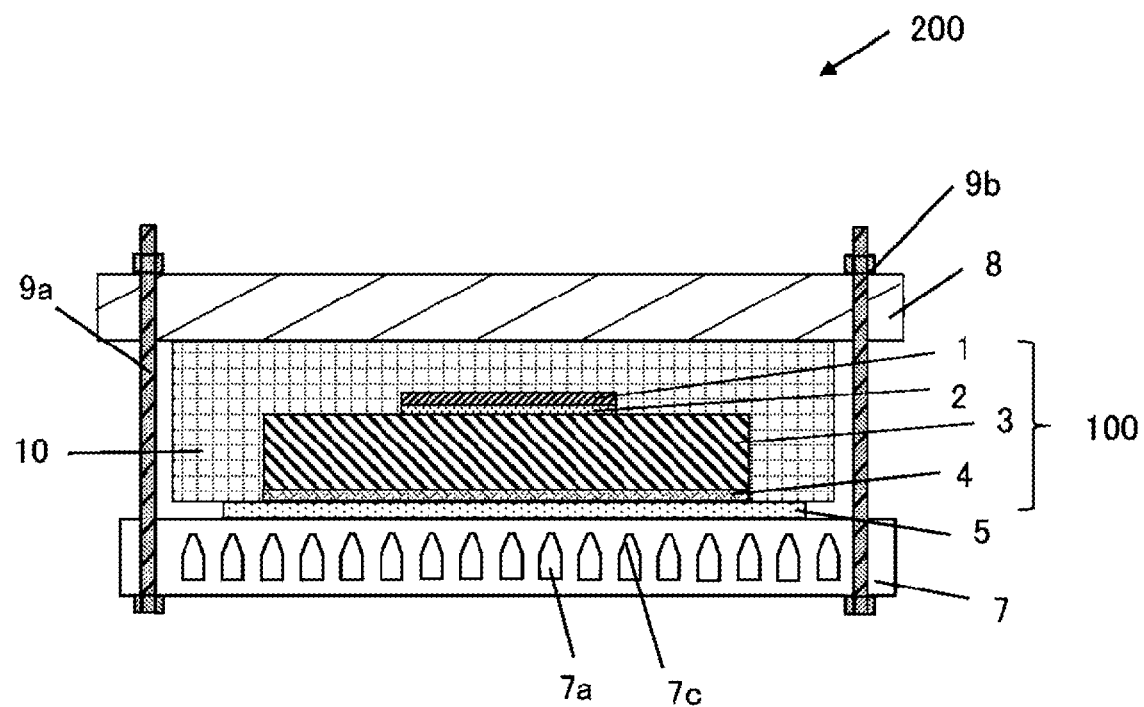
FIG. 10 is a cross-sectional view illustrating a power semiconductor device according to Modification Example 2.

FIG. 10 is a cross-sectional view illustrating a modification example of the power semiconductor device 200. The same portions as those in FIG. 4 are denoted by the same reference signs, and the description thereof will be omitted. The present modification example is different from a point of the cross-sectional shape of the cooling water channel pipe 7a of the heat dissipation member 7 illustrated in FIG. 4.

In the first embodiment, a case where the cross-sectional shape of the cooling water channel pipe 7a of the heat dissipation member 7 is rectangular has been described. In the present modification example, as illustrated in FIG. 10, the cross-sectional shape of the cooling water channel pipe 7a is hexagonal, and the side wall of the cooling water channel pipe 7a forms a tapered portion 7c toward the circuit body 100. By forming the tapered portion 7c on the side wall of the cooling water channel pipe 7a, it is possible to further equalize the surface pressure of the heat dissipation member 7 in close contact with the thermally conductive layer 5. When the cross-sectional shape of the cooling water channel pipe 7a is rectangular, the heat dissipation member 7 is substantially thin at the side portion of the rectangle facing the circuit body 100 side. Thus, the surface pressure of the heat dissipation member 7 in close contact with the thermally conductive layer 5 may be weakened at the position of the cooling water channel pipe 7a. The cross-sectional shape of cooling water channel pipe 7a is not limited to a hexagonal shape, and may be a pentagonal shape, a triangular shape, or the like. A shape in which the side wall of the cooling water channel pipe 7a forms the tapered portion 7c, and the cross-sectional shape of the cooling water channel pipe 7a becomes thinner toward the circuit body 100 may be provided. Furthermore, the cross-sectional shape of the cooling water channel pipe 7a may be an elliptical shape, and in this case, the tapered portion 7c of the side wall of the cooling water channel pipe 7a is curved.

In the power semiconductor device 200 in the present modification example, it is possible to generate uniform compressive stress in the thermally conductive layer 5 by the heat dissipation member 7, and to realize the power semiconductor device 200 in which the contact thermal resistance of the thermally conductive layer 5 is reduced, and the heat dissipation performance is high.

Modification Example 3

Figure 11:
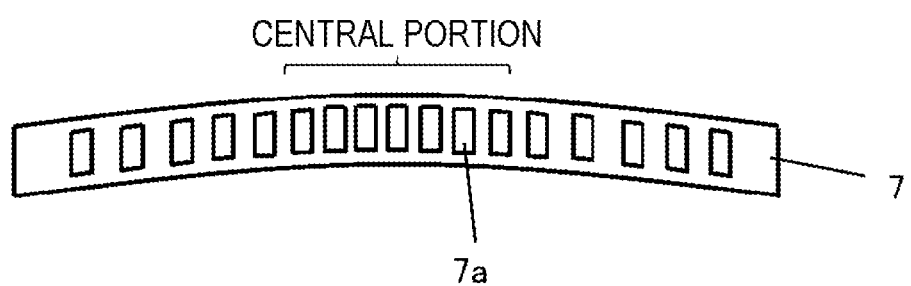
FIG. 11 is a cross-sectional view illustrating a heat dissipation member according to Modification Example 3.

FIG. 11 is a cross-sectional view illustrating a modification example of the heat dissipation member 7. The members other than the heat dissipation member 7 are similar to those in FIG. 2, and the configuration of the manufactured power semiconductor device 200 is similar to that in FIG. 4. In the present modification example, the arrangement density of the cooling water channel pipes 7a is different.

As illustrated in FIG. 11, cooling water channel pipes 7a provided in the heat dissipation member 7 are arranged more densely in the central portion of the heat dissipation member 7, and are arranged more sparsely toward the end portion of the heat dissipation member 7. The rigidity of the load application portion at the end portion of the heat dissipation member 7 is desirably higher than the rigidity of the heat dissipation portion that is the central portion of the heat dissipation member 7. By making the rigidity of the load application portion of the end portion higher than the rigidity of the heat dissipating portion, it is possible to elastically deform the heat dissipation portion with high efficiency when the end portion is forcibly displaced by the connection member 9 such as a bolt, and a load is applied.

After manufacturing the power semiconductor device 200, the heat dissipation member 7 is elastically deformed by the fixing member 8 and the connection member 9, and the heat dissipation member 7 is fixed in close contact with the heat dissipation surface 4a of the circuit body 100 via the thermally conductive layer 5.

In the present modification example, the example in which the cross-sectional shape of the cooling water channel pipe 7a is rectangular has been described. As described in Modification Example 2, the cross-sectional shape of the cooling water channel pipe 7a may be configured to form the tapered portion 7c such as a hexagon, a pentagon, a triangle, or an ellipse. Further, the cooling water channel pipe 7a having a large cross-sectional shape may be disposed in the central portion of the heat dissipation member 7, and the cooling water channel pipe 7a having a smaller cross-sectional shape may be disposed toward the end portion of the heat dissipation member 7. The heat dissipation member described in the present modification example may be applied to the power semiconductor device 200 provided with the ceramic substrate 11 with a conductor, which has been described in Modification Example 1.

According to the present modification example, when the heat dissipation member 7 is forcibly displaced by the connection member 9 and a load is applied, the heat dissipation portion is efficiently elastically deformed, and the compressive stress is easily generated in the vicinity of the central portion of the thermally conductive layer 5. In addition, since the temperature of the central portion close to the power semiconductor element 1 that generates heat is the highest, it is possible to improve the heat dissipation by densely forming the water channels in the central portion.

Second Embodiment

Figure 12:
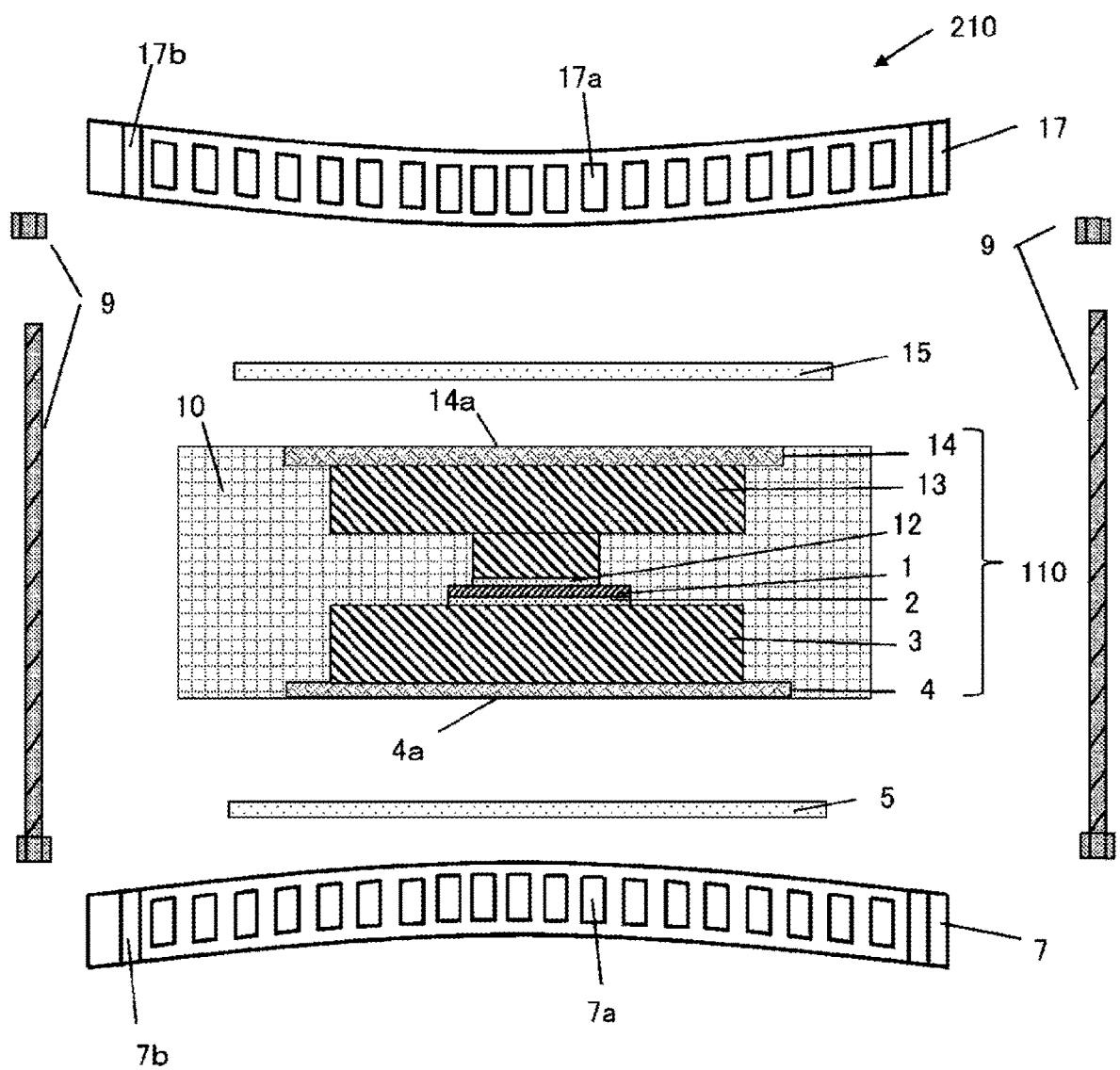
FIG. 12 is a cross-sectional view of a power semiconductor device according to a second embodiment, illustrating a first step.

FIG. 12 is a cross-sectional view of a power semiconductor device 210 according to the present embodiment, illustrating a first step. The same portions as those of the power semiconductor device 200 illustrated in FIG. 2 being the first embodiment are denoted by the same reference signs, and the description thereof will be omitted. The present embodiment is different in that a heat dissipation member 17 is provided instead of the fixing member 8 illustrated in FIG. 2. An example of the power semiconductor device 200 for single side cooling has been described in the first embodiment, but an example of the power semiconductor device 210 for double side cooling will be described in the present embodiment.

As illustrated in FIG. 12, each electrode of the power semiconductor element 1 is sandwiched between the first conductor 3 and the second conductor 13 arranged to face the respective electrode surfaces. The power semiconductor element 1, the first conductor 3, and the second conductor 13 are bonded to each other by the bonding materials 2 and 12. The first conductor 3 and the second conductor 13 are formed of, for example, copper, a copper alloy, aluminum, an aluminum alloy, or the like. The bonding materials 2 and 12 are formed of a solder material, a sintered material, or the like. The first conductor 3 is connected to the back electrode of the power semiconductor element 1, and the second conductor 13 is connected to the front electrode. Although an example in which the second conductor 13 is formed by the same member has been described, the second conductor may be formed by bonding a plurality of members.

The insulating layers 4 and 14 having thermal conductivity are connected to the surfaces of the first conductor 3 and the second conductor 13, which are opposite to the surface to which the power semiconductor element 1 is connected. The insulating layers 4 and 14 thermally conduct heat generated from the power semiconductor element 1 to the heat dissipation members 7 and 17, and are formed of a material having high thermal conductivity and a high withstand voltage. For example, ceramics such as aluminum oxide (alumina), aluminum nitride, and silicon nitride, or an insulating sheet or an adhesive containing the fine powders of the ceramics can be used.

A circuit body 110 is formed by being sealed with the sealing resin 10 such that the surfaces of the insulating layers 4 and 14 are exposed. The surfaces of the insulating layers 4 and 14 exposed from the sealing resin 10 serve as the heat dissipation surfaces 4a and 14a of the circuit body 110.

The thermally conductive layers 5 and 15 are provided to be thermally connected to the heat dissipation surfaces 4a and 14a of the circuit body 110. As the thermally conductive layers 5 and 15, grease, thermal interface material (TIM), or the like can be used. The heat dissipation members 7 and 17 are disposed on the surfaces of the thermally conductive layers 5 and 15 on the opposite side of the circuit body 110. The heat dissipation members 7 and 17 are disposed to interpose the circuit body 110, and the connection member 9 that connects and fixes the heat dissipation members 7 and 17 to sandwich the circuit body 110 at both end portions of the heat dissipation members 7 and 17 is disposed.

The heat dissipation members 7 and 17 have a shape in which the central portion thereof is curved to protrude toward the circuit body 110. A multi-hole tube cooling water channel in which a plurality of tubular cooling water channel pipes 7a and 17a serving as flow paths of cooling water are provided will be described as an example of the heat dissipation members 7 and 17. Holes 7b and 17b through which the connection members 9 described later pass are provided at both end portions of the heat dissipation members 7 and 17.

The shapes of the heat dissipation members 7 and 17 curved to protrude toward the circuit body 110 are formed by using a curved mold when processed by extrusion molding. Thus, it is possible to form the heat dissipation members 7 and 17 having a curved shape without increasing the number of steps and cost. In addition, the heat dissipation members 7 and 17 having a curved shape can be formed by warping the heat dissipation members 7 and 17 by press working. The cooling water channel pipes 7a and 17a are processed by extrusion molding. The heat dissipation members 7 and 17 are formed of a member having thermal conductivity, for example, a composite material such as Cu, a Cu alloy, Cu—C, or Cu—CuO, or a composite material such as Al, an Al alloy, AlSiC, or Al—C.

As will be described later, the connection member 9 is a member that connects and fixes the heat dissipation member 7 and the heat dissipation member 17 at the respective end portions. As the connection member 9, for example, a bolt and a nut made of stainless steel are used.

Figure 13:
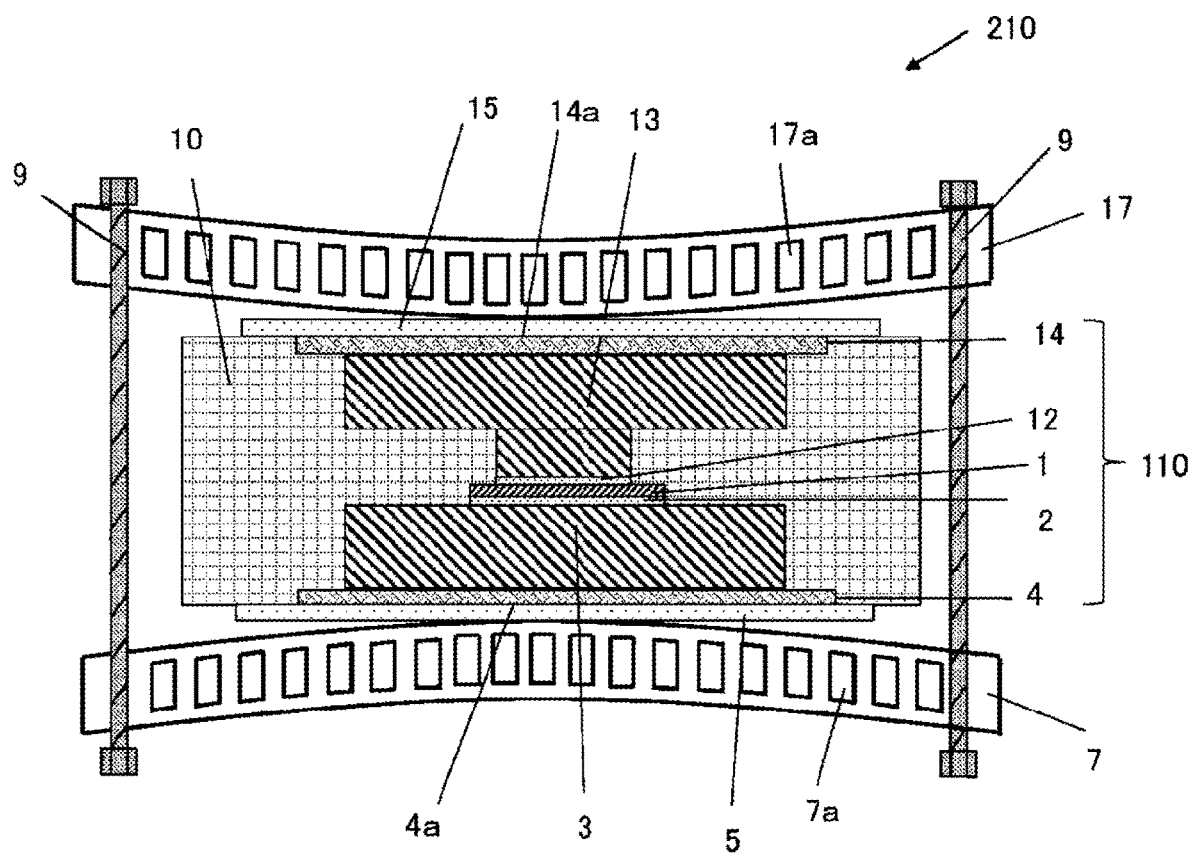
FIG. 13 is a cross-sectional view of the power semiconductor device in the second embodiment, illustrating a second step.

FIG. 13 is a cross-sectional view of the power semiconductor device 210 according to the present embodiment, illustrating a second step.

As illustrated in FIG. 13, the thermally conductive layers 5 and 15 abut on the heat dissipation surfaces 4a and 14a of the circuit body 110. Further, the heat dissipation member 7 abuts on the outside of the thermally conductive layer 5 on the side of the heat dissipation surface 4a of the circuit body 110. The heat dissipation member 17 abuts on the outside of the thermally conductive layer 15 on the side of the heat dissipation surface 14a of the circuit body 110. The connection member 9 penetrates at the respective end portions of the heat dissipation member 7 and the heat dissipation member 17. FIG. 13 illustrates a state before a bolt and a nut of the connection member 9 are tightened. The heat dissipation members 7 and 17 hold a curved shape such that the central portions of the heat dissipation members 7 and 17 protrude toward the circuit body 110.

Next, a third step of the power semiconductor device 210 according to the present embodiment will be described.

In the state illustrated in FIG. 13, the bolt and the nut of the connection member 9 are fastened and fixed at both ends of the heat dissipation members 7 and 17 so as to sandwich the circuit body 110. At this time, the heat dissipation member 17 acts as a fixing member of the heat dissipation member 7, and the heat dissipation member 7 acts as a fixing member of the heat dissipation member 17. At this time, the heat dissipation members 7 and 17 are elastically deformed. As a result, the heat dissipation members 7 and 17 are brought into close contact with the heat dissipation surfaces 4a and 14a of the circuit body 110 via the thermally conductive layers 5 and 15, and the surface pressure is applied from the heat dissipation members 7 and 17 to the heat dissipation surfaces 4a and 14a.

The heat dissipation members 7 and 17 having a shape curved to protrude toward the circuit body 110 are elastically deformed by fastening the connection member 9, such that the amount of protrusion toward the circuit body 110 decreases. At this time, it is preferable that the amounts of protrusion of the heat dissipation members 7 and 17 after fixing are slightly convex toward the circuit body 110 or has a flat shape. Thus, it is possible to generate the surface pressure in the compression direction in a wide region including the vicinity of the center of the thermally conductive layers 5 and 15, in the thermally conductive layers 5 and 15. The surface pressure at which the heat dissipation members 7 and 17 are in close contact with the thermally conductive layers 5 and 15 may be set to be larger on the central portion side of the circuit body 110 than on the end portion side of the circuit body 110. Furthermore, the heat dissipation members 7 and 17 in a state where the heat dissipation members 7 and 17 are fixed while being elastically deformed may be set to have a shape protruding toward the circuit body 110 in the central portions of the heat dissipation members 7 and 17, or to have a flat shape toward the circuit body 110 on the entire surfaces of the heat dissipation members 7 and 17. As a result, it is possible to realize the power semiconductor device 210 in which the contact thermal resistance of the thermally conductive layers 5 and 15 is reduced, and the heat dissipation performance is high.

In the present embodiment, the example in which the cross-sectional shapes of the cooling water channel pipes 7a and 17a are rectangular has been described. As described in Modification Example 2 of the first embodiment, the cross-sectional shapes of the cooling water channel pipes 7a and 17a may be configured to form the tapered portion 7c such as a hexagon, a pentagon, a triangle, or an ellipse. Furthermore, as described in Modification Example 3 of the first embodiment, the cooling water channel pipes 7a and 17a provided in the heat dissipation members 7 and 17 may be formed more densely at the central portions of the heat dissipation members 7 and 17, and may be formed sparsely toward the end portions of the heat dissipation members 7 and 17. Furthermore, as described in Modification Example of the first embodiment, a ceramic substrate with a conductor may be provided instead of the insulating layers 4 and 14.

According to the present embodiment, in the case of cooling both surfaces of the circuit body 110, the heat dissipation members 7 and 17 having a shape curved to protrude toward the circuit body 110 are arranged to sandwich the circuit body 110, and the heat dissipation members 7 and 17 are fixed to be elastically deformed. In this manner, it is possible to obtain the power semiconductor device 210 having high heat dissipation, without adding the fixing member 8.

Modification Example 4

Figure 14:
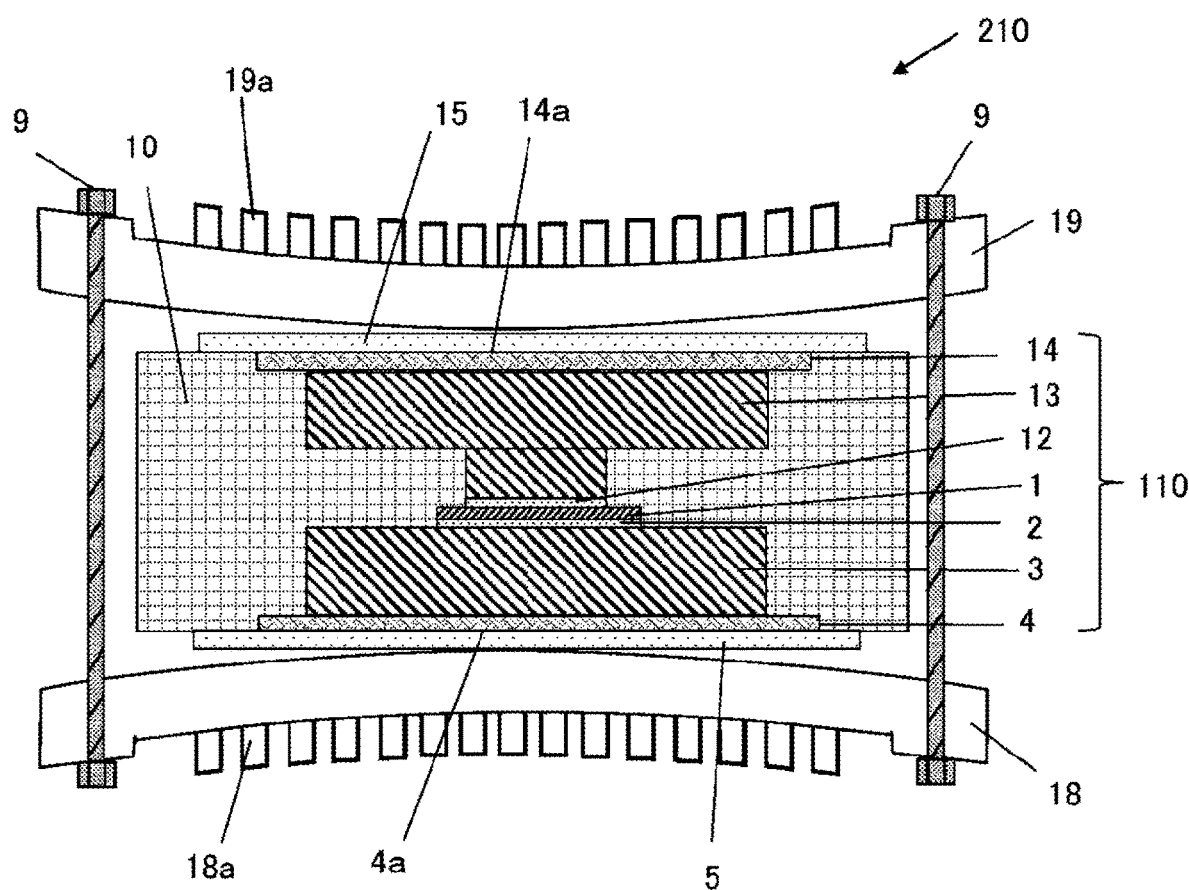
FIG. 14 is a cross-sectional view illustrating a power semiconductor device according to Modification Example 4.

FIG. 14 is a cross-sectional view illustrating a modification example of the power semiconductor device 210. The same portions as those in FIG. 13 are denoted by the same reference signs, and the description thereof will be omitted. The configurations of the heat dissipation members 7 and 17 illustrated in FIG. 13 are different.

FIG. 14 illustrates the second step in the present modification. As illustrated in FIG. 14, heat dissipation members 18 and 19 have heat dissipation fins 18a and 19a on the surfaces thereof. The shapes of the heat dissipation fins 18a and 19a may be pin fins, straight fins, or corrugated fins.

The heat dissipation members 18 and 19 are formed of a member having electrical conductivity, for example, a composite material such as Cu, a Cu alloy, Cu—C, or Cu—CuO, or a composite material such as Al, an Al alloy, AlSiC, or Ai-C.

The heat dissipation members 18 and 19 have a shape in which the central portion thereof is curved to protrude toward the circuit body 110. The heat dissipation member 18 abuts on the outside of the thermally conductive layer 5 on the side of the heat dissipation surface 4a of the circuit body 110. The heat dissipation member 19 abuts on the outside of the thermally conductive layer 15 on the side of the heat dissipation surface 14a of the circuit body 110. The connection member 9 penetrates at the respective end portions of the heat dissipation members 18 and 19. FIG. 14 illustrates a state before a bolt and a nut of the connection member 9 are tightened. The heat dissipation members 18 and 19 hold a curved shape such that the central portions of the heat dissipation members 18 and 19 protrude toward the circuit body 110.

In the third step, in the state illustrated in FIG. 14, the bolt and the nut of the connection member 9 are fastened and fixed at both ends of the heat dissipation members 18 and 19 so as to sandwich the circuit body 110. At this time, the heat dissipation members 18 and 19 are elastically deformed. As a result, the heat dissipation members 18 and 19 are brought into close contact with the heat dissipation surfaces 4a and 14a of the circuit body 110 via the thermally conductive layers 5 and 15, and the surface pressure is applied from the heat dissipation members 18 and 19 to the heat dissipation surfaces 4a and 14a. Regarding the heat dissipation members 18 and 19, by making the rigidity of the load application portion of the end portion higher than the rigidity of the central portion, it is possible to elastically deform the central portion with high efficiency when the end portion is forcibly displaced by the connection member 9 such as a bolt, and a load is applied. As illustrated in FIG. 14, the plate thickness of the end portions being the load application portions of the heat dissipation members 18 and 19 is set to be greater than the plate thickness of the central portion. It is preferable that the amounts of protrusion of the heat dissipation members 18 and 19 after fixing are slightly convex toward the circuit body 110 or has a flat shape. Thus, it is possible to generate the surface pressure in the compression direction in a wide region including the vicinity of the center of the thermally conductive layers 5 and 15, in the thermally conductive layers 5 and 15. As a result, it is possible to obtain the power semiconductor device 210 in which the contact thermal resistance of the thermally conductive layers 5 and 15 is reduced, and the heat dissipation performance is high.

In FIG. 14, covers on the outsides of the heat dissipation fins 18a and 19a of the heat dissipation members 18 and 19 are not illustrated, but the covers may be provided to form a flow path of cooling water.

In FIG. 14, an example in which the heat dissipation members 18 and 19 having the heat dissipation fins 18a and 19a are provided on both surfaces sandwiching the circuit body 110 has been described. However, as in FIG. 4, a configuration in which the heat dissipation member 18 having the heat dissipation fin 18a is provided on one surface of the circuit body 100 may be made.

In the above-described embodiments, an example in which the sealing resin 10 encloses the insulating layers 4 and 14 and portions other than the heat dissipation surfaces 4a and 14a are sealed has been described, but the first conductor 3 and the second conductor 13 may be sealed with the sealing resin 10. When the insulating layers 4 and 14 are connected to the first conductor 3 and the second conductor 13, respectively, the same effect can be obtained.

Furthermore, in the above-described embodiments, a case of one power semiconductor element 1 has been described, but the present invention can be similarly applied to the power semiconductor devices 200 and 210 in which a plurality of power semiconductor elements 1 are mounted.

According to the embodiment described above, the heat dissipation members 7, 17, 18, and 19 curved to protrude toward the central portions on the circuit bodies 100 and 110 sides are elastically deformed. Thus, the heat dissipation members 7, 17, 18, and 19 is caused to act as leaf springs, and the heat dissipation members 7, 17, 18, and 19 are pressed against the heat dissipation surfaces of the central portions of the circuit bodies 100 and 110, thereby generating the surface pressure in the compression direction. As a result, it is possible to realize the power semiconductor devices 200 and 210 in which the contact thermal resistance between the heat dissipation surfaces of the circuit bodies 100 and 110 and the heat dissipation members 7, 17, 18, and 19 is reduced, and the heat dissipation performance is high.

According to the embodiment described above, the following operational effects can be obtained.

(1) The power semiconductor device 200 includes the circuit body 100 in which the power semiconductor element 1 is mounted, the heat dissipation member 7 that is disposed on the heat dissipation surface 4a side of the circuit body 100 and dissipates heat of the circuit body 100, and the fixing member 8 that is disposed on the side of the circuit body 100 opposite to the heat dissipation surface 4a. When the heat dissipation member 7 and the fixing member 8 are connected and fixed, the heat dissipation member 7 curved to protrude toward the central portion on the heat dissipation surface 4a side is elastically deformed to come into close contact with the heat dissipation surface 4a side. Thus, it is possible to enhance the close contact with the heat dissipation surface and improve the heat dissipation performance.

(2) The manufacturing method of the power semiconductor device 200 includes disposing the heat dissipation member 7 curved to protrude toward the central portion on the circuit body 100 side, on the heat dissipation surface 4a of the circuit body 100 in which the power semiconductor element 1 is mounted, disposing the fixing member 8 on the surface of the circuit body 100 opposite to the heat dissipation surface 4a, and connecting and fixing the heat dissipation member 7 and the fixing member 8 so that the heat dissipation member 7 is elastically deformed so as to apply surface pressure to the heat dissipation surface 4a of the circuit body 100. Thus, it is possible to enhance the close contact with the heat dissipation surface and improve the heat dissipation performance.

(3) The manufacturing method of the power semiconductor device 210 includes disposing the heat dissipation member 7 curved to protrude toward the central portion on the circuit body 110 side, on the heat dissipation surface 4a of the circuit body 110 in which the power semiconductor element 1 is mounted, disposing the heat dissipation member 17 curved to protrude toward the central portion on the circuit body 110 side, on the heat dissipation surface 14a on the opposite side of the heat dissipation surface 4a of the circuit body 110, and connecting and fixing the heat dissipation members 7 and 17 so that the heat dissipation members 7 and 17 are elastically deformed so as to apply surface pressure to the heat dissipation surface 4a and the heat dissipation surface 14a of the circuit body 110. Thus, it is possible to enhance the close contact with the heat dissipation surface and improve the heat dissipation performance.

The present invention is not limited to the above-described embodiments, and other forms conceivable within the scope of the technical idea of the present invention are also included in the scope of the present invention as long as the characteristics of the present invention are not impaired. Further, the above-described embodiments and the plurality of modification examples may be combined.

REFERENCE SIGNS LIST 1 power semiconductor element
2 bonding material
3 first conductor
4, 14 insulating layer
4a, 14a heat dissipation surface
5, 15 thermally conductive layer
7, 17, 18, 19 heat dissipation member
7a, 17a cooling water channel pipe
7c tapered portion
8 fixing member
9 connection member
10 sealing resin
11 ceramic substrate with conductor
11a ceramic substrate
11b first conductor layer
11c second conductor layer
12 bonding material
13 second conductor
18a, 19a heat dissipation fin
100, 110 circuit body
200, 210 power semiconductor device

The invention claimed is:

1. A power semiconductor device comprising:
a circuit body in which a power semiconductor element is mounted;
a first heat dissipation member that is disposed on a first heat dissipation surface side of the circuit body and dissipates heat of the circuit body; and
a fixing member that is disposed on a side of the circuit body opposite to the first heat dissipation surface,
wherein, when the first heat dissipation member and the fixing member are connected and fixed, the first heat dissipation member curved to protrude toward a central portion on the first heat dissipation surface side is elastically deformed to come into close contact with the first heat dissipation surface side, and
wherein bending rigidity of the first heat dissipation member at a portion at which the first heat dissipation member and the fixing member are connected and fixed is higher than bending rigidity of a central portion of the first heat dissipation member.

2. The power semiconductor device according to claim 1, wherein
the fixing member is a second heat dissipation member disposed on a second heat dissipation surface side opposite to the first heat dissipation surface side, and
when the first heat dissipation member and the second heat dissipation member are connected and fixed, the first heat dissipation member curved to protrude toward the central portion on the first heat dissipation surface side and the second heat dissipation member curved to protrude toward a central portion on the second heat dissipation surface side are elastically deformed to come into close contact with the first heat dissipation surface side and the second heat dissipation surface side with the circuit body sandwiched between the first heat dissipation member and the second heat dissipation member.

3. The power semiconductor device according to claim 2, wherein the bending rigidity of the first heat dissipation member and bending rigidity of the second heat dissipation member at the portion at which the first heat dissipation member and the second heat dissipation member are connected and fixed is higher than the bending rigidity of the central portion of the first heat dissipation member and a central portion of the second heat dissipation member.

4. The power semiconductor device according to claim 1, wherein
a plate thickness of the first heat dissipation member at the portion at which the first heat dissipation member and the fixing member are connected and fixed is greater than a plate thickness of the central portion of the first heat dissipation member.

5. The power semiconductor device according to claim 3, wherein plate thicknesses of the first heat dissipation member and the second heat dissipation member at the portion at which the first heat dissipation member and the second heat dissipation member are connected and fixed are greater than plate thicknesses of the central portions of the first heat dissipation member and the second heat dissipation member, respectively.

6. The power semiconductor device according to claim 1, wherein the first heat dissipation member in an elastically deformed state has a shape protruding toward the circuit body or a flat shape.

7. The power semiconductor device according to claim 2, wherein the first heat dissipation member and the second heat dissipation member in an elastically deformed state have a shape protruding toward the circuit body or a flat shape.

8. The power semiconductor device according to claim 1, wherein the first heat dissipation member includes a plurality of cooling water channel pipes formed by extrusion molding.

9. The power semiconductor device according to claim 2, wherein the first heat dissipation member and the second heat dissipation member include a plurality of cooling water channel pipes formed by extrusion molding.

10. The power semiconductor device according to claim 8, wherein a side wall in at least one of the plurality of cooling water channel pipes forms a tapered portion toward the circuit body.

11. The power semiconductor device according to claim 9, wherein an arrangement density of the plurality of cooling water channel pipes is densely arranged in central portions of the first heat dissipation member and the second heat dissipation member.

12. The power semiconductor device according to claim 2, wherein the first heat dissipation member and the second heat dissipation member include heat dissipation fins.

* * * * *